US011243078B2

(12) United States Patent
Che et al.

(10) Patent No.: US 11,243,078 B2
(45) Date of Patent: Feb. 8, 2022

(54) FTR LOOP OF A GYRO APPARATUS

(71) Applicant: Panasonic Intellectual Property Management Co., Ltd., Osaka (JP)

(72) Inventors: Chihchuan Che, Northborough, MA (US); Yaesuk Jeong, Hudson, MA (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 207 days.

(21) Appl. No.: 16/361,680

(22) Filed: Mar. 22, 2019

(65) Prior Publication Data

US 2020/0300629 A1 Sep. 24, 2020

(51) Int. Cl.

*G01C 19/5776* (2012.01)
*H03M 1/06* (2006.01)
*H03M 1/08* (2006.01)
*H03M 1/18* (2006.01)
*H03M 1/50* (2006.01)
*H03M 1/82* (2006.01)

(52) U.S. Cl.

CPC ...... *G01C 19/5776* (2013.01); *H03M 1/0626* (2013.01); *H03M 1/0854* (2013.01); *H03M 1/183* (2013.01); *H03M 1/504* (2013.01); *H03M 1/822* (2013.01)

(58) Field of Classification Search

CPC ........... G01C 19/5776; G01C 19/5698; H03M 1/0854; H03M 1/183; H03M 1/504; H03M 1/822

USPC ........................................... 73/503.3, 514.17

See application file for complete search history.

(56) References Cited

U.S. PATENT DOCUMENTS

2010/0307241 A1* 12/2010 Raman .................. G01C 19/56 73/504.12
2015/0358724 A1* 12/2015 Petkov ..................... H04R 3/00 381/95
2016/0242645 A1* 8/2016 Muller .................... H04L 27/06

FOREIGN PATENT DOCUMENTS

EP 1914512 A2 4/2008

OTHER PUBLICATIONS

International Search Report of PCT application No. PCT/JP2020/010037 dated Jun. 17, 2020.

* cited by examiner

*Primary Examiner* — Nimeshkumar D Patel
*Assistant Examiner* — Jean F Morello
(74) *Attorney, Agent, or Firm* — Westerman, Hattori, Daniels & Adrian, LLP

(57) ABSTRACT

A signal processing circuit for a gyroscope apparatus is disclosed. The signal processing circuit includes a first electrode and a second electrode pairing with the first electrode. The signal processing circuit, being a negative feedback loop circuit, is configured to be connected with the first electrode and the second electrode and comprises a demodulator configured to convert a current from the first electrode into a voltage and demodulate the converted voltage to output a demodulated signal, an analog-to-digital converter configured to convert the demodulated signal from the demodulator into a digital signal, a proportional-integral-derivative controller that is connected to the analog-to-digital converter, a digital-to-analog converter configured to convert an output signal from the proportional-integral-derivative controller to an analog signal, and a modulator configured to be electrically connected with the second electrode and to be electrically connected with the digital-to-analog converter.

18 Claims, 10 Drawing Sheets

Gyroscope Apparatus 100
Analog Out
Processing Circuit 20
Second Electrode 1B
Drive Electrode 1C
Drive Electrode 1D
Gyro 1E
First Electrode 1A
Multi-bit Digital Data
Multi-bit Digital Data
Synchronous Signal
Drive Voltage
Drive Current
Drive Circuit 30

FTR LOOP OF A GYRO APPARATUS

BACKGROUND

1. Field of the Invention

At least one example embodiment relates to a signal processing circuit for a gyroscope apparatus, and more particularly, to a signal processing circuit for achieving a bandwidth extension and a large loop gain for the gyroscope apparatus.

2. Description of the Related Art

BAW (Bulk Acoustic Wave) MEMS (microelectromechanical system) gyroscope apparatus has a great advantage over a conventional MEMS gyroscope because of its high quality factor (Q) operation in a mode-matched condition. However, the high quality factor gyroscope makes its operation in an open-loop configuration difficult.

Therefore, there is an urgent need to have a signal processing circuit for the gyroscope apparatus with a negative feedback loop, which can extend a rate detection bandwidth and enable the gyroscope apparatus to be not sensitive to a temperature (i.e., making a quality factor of the gyroscope insensitive to the temperature). In other words, there is a need to have the circuit, which could produce a large and stable gain by nulling the Coriolis force sensed.

SUMMARY

According to an aspect, there is provided a signal processing circuit for a gyroscope apparatus. The signal processing circuit for a gyroscope apparatus may include a first electrode and a second electrode pairing with the first electrode. The signal processing circuit may be a negative feedback loop circuit configured to be connected with the first electrode and the second electrode. The signal processing circuit may include a demodulator configured to convert a current from the first electrode into a voltage and demodulate the converted voltage to output a demodulated signal, an analog-to-digital converter configured to convert the demodulated signal from the demodulator into a digital signal, a proportional-integral-derivative controller that is connected to the analog-to-digital converter, a digital-to-analog converter configured to convert an output signal from the proportional-integral-derivative controller to an analog signal, and a modulator configured to be electrically connected with the second electrode and to be electrically connected with the digital-to-analog converter.

The demodulator may include a first transimpedance amplifier, a voltage-to-voltage amplifier, and a first mixer configured to demodulate the converted voltage and outputting to the analog-to-digital converter.

The signal processing circuit may include a first filter configured to reduce a shaped quantization noise of the demodulated signal from the demodulator before outputting to the proportional-integral-derivative controller.

The analog-to-digital converter may be a 1 bit, 3rd-order continuous-time sigma delta modulator.

The digital-to-analog converter may be a 1 bit, 3rd-order digital sigma delta modulator.

The signal processing circuit may include a second filter electrically connecting with the digital-to-analog converter and the modulator. Here, the proportional-integral-derivative controller completely converts the digital signal converted by the analog-to-digital converter to a multi-bit digital data and outputs the multi-bit digital data to the digital-to-analog converter, and the second filter receives the analog signal from the digital-to-analog converter and is configured to reshape the analog signal.

The second filter may filter a quantization noise from the reshaped analog signal.

The second filter may be a 2nd-order switched capacitor filter.

The first filter may be a cascaded integrator-comb filter without a decimator.

The proportional-integral-derivative controller may accurately fix a digital gain based on a quality factor of the gyroscope.

The modulator may include a second transimpedance amplifier, a second mixer, and a voltage-to-current amplifier, and the second mixer may be a pair of switches that are switched with a square-wave rail-to-rail signal.

The proportional-integral-derivative controller may be a digital proportional-integral-derivative controller.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
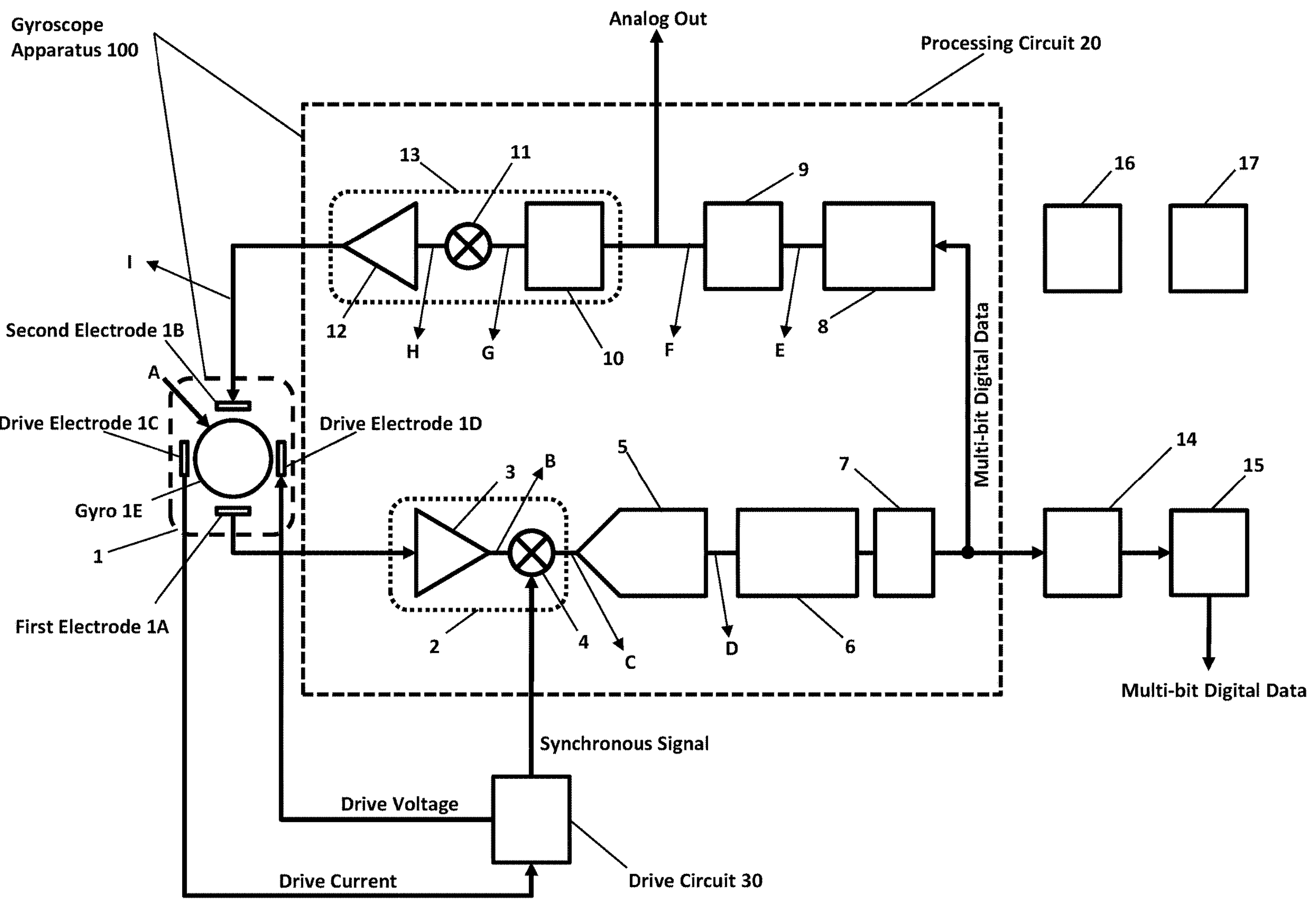
FIG. 1 is a diagram illustrating an example of a signal processing circuit for a gyroscope apparatus according to an example embodiment.

The following structural or functional descriptions of example embodiments described herein are merely intended for the purpose of describing the example embodiments described herein and may be implemented in various forms. Here, the example embodiments are not construed as limited to the disclosure and should be understood to include all changes, equivalents, and replacements within the technical idea of the present disclosure.

Hereinafter, example embodiments will be described in detail with reference to the accompanying drawings. Regarding the reference numerals assigned to the elements in the drawings, it should be noted that the same elements will be designated by the same reference numerals, wherever possible, even though they are shown in different drawings. Also, in the description of example embodiments, detailed description of well-known related structures or functions will be omitted when it is deemed that such description will cause ambiguous interpretation of the present disclosure.

FIG. 1 is a diagram illustrating an example of a processing circuit 20 of a gyroscope apparatus 100. Before going into detail on the processing circuit 20, the gyroscope apparatus 100 is briefly described.

The gyroscope apparatus 100 has a gyroscope 1, a processing circuit 20 and a drive circuit 30. The gyroscope 1 has a first electrode 1A, a second electrode 1B, drive electrodes 1C, 1D and a gyro 1E. The gyro 1E faces and has capacitive coupling with each of the electrodes 1A-1D. The first electrode 1A electrically connects with the second electrode 1B via the processing circuit 20. And the first electrode 1A and the second electrode 1B dispose to sandwich gyro 1E and face each other. In the other word, the first electrode 1A and the second electrode 1B are pairing with each other. In this embodiment, the first electrode 1A is used as a sensor electrode, and the second electrode 1B is used as a force to rebalance (FTR) electrode.

The drive electrodes 1C, 1D electrically connect with each other via the drive circuit 30. And the drive electrodes 1C, 1D dispose to sandwich gyro 1E and face each other. In the other word, the drive electrode 1C and the drive electrode 1D are pairing with each other. In this embodiment, the drive electrode 1C outputs the drive current to the drive circuit 30, and the drive electrode 1D applies a drive voltage from the drive circuit 30 to gyro 1E.

The drive circuit 30 receives the drive current from the drive electrode 1C and converts the drive current to the drive voltage. And the drive circuit 30 outputs the drive voltage to the drive electrode 1D. In this way, the drive circuit 30 drives the gyroscope 1 element such as gyro 1E. Furthermore, the drive circuit 30 outputs a synchronous signal to a demodulator 2 of the processing circuit 20.

Referring to FIG. 1, the processing circuit 20 is described below. A Force-To-Rebalance (FTR) loop is implemented to apply a differential voltage to the FTR+/− electrodes so that the Coriolis force is nulled in the gyroscope 1. This is achieved via a negative feedback loop, as shown in FIG. 1.

Unlike an open loop architecture, which amplifies a rate current directly, the FTR architecture amplifies an error current, which is proportional to the difference between the Coriolis force and the FTR force. This negative feedback loop achieves two objectives when a loop gain is high: bandwidth extension and insensitivity to the forward path gain. In the first objective, the bandwidth extension is required due to the small bandwidth of the design (<10 Hz). In the second objective, the large loop gain means that the quality factor (Q) variation of the gyroscope becomes desensitized.

When the gyroscope 1 experiences the Coriolis force, a transimpedance amplifier (TLA)/current-to-voltage amplifier 3 converts a current to a voltage. The voltage is then demodulated via a mixer (Gilbert cell) 4 in the forward path. A demodulator 2 includes the TIA/voltage-to-voltage amplifier 3, and the mixer 4. And the demodulator 2 demodulates a signal by synchronous signal from the drive circuit 30. Especially, the drive circuit 30 inputs the synchronous signal to the mixer 4.

The demodulated signal represents the rate, which is then converted to its digital equivalent word via a 1 bit, 3rd-order continuous-time sigma delta modulator 5. The shaped quantization noise of the digital bitstream from the sigma delta modulator 5 is first reduced by the 4th-order boxcar filter 6 before going through the digital proportional-integral-derivative (PID) 7.

The PID 7 currently implemented has "P" and "I". The "I" is required to achieve even higher forward gain at a low frequency, and the "P" is implemented to compensate for a pole introduced by the gyroscope. There is also a digital gain in front of the actual "P" and "I" to set the forward gain. The output of the PID 7 is the system output, which represents the rate detected.

In the return path, the digital rate output is modulated in the pulse width modulation fashion, and its quantization noise is reshaped via a 1 bit, 3rd-order digital sigma delta modulator 8. The quantization noise generated in the process of reducing resolution from 20 bit to 1 bit is filtered through a 2nd-order switched capacitor filter 9. The output of the switched capacitor filter 9 goes through the reverse signal processing of the forward-path electronics. That is, the baseband rate current is amplitude modulated onto the gyroscope carrier frequency and applied via a TIA 12 to drive the FTR+/− electrodes. A modulator 13 includes a voltage-current amplifier 10, a mixer (passive mixer) 11, and the TIA 12 and eliminates noise.

The main blocks in the FTR loop are described in detail below.

First Filter (Boxcar Filter)

Figure 2:
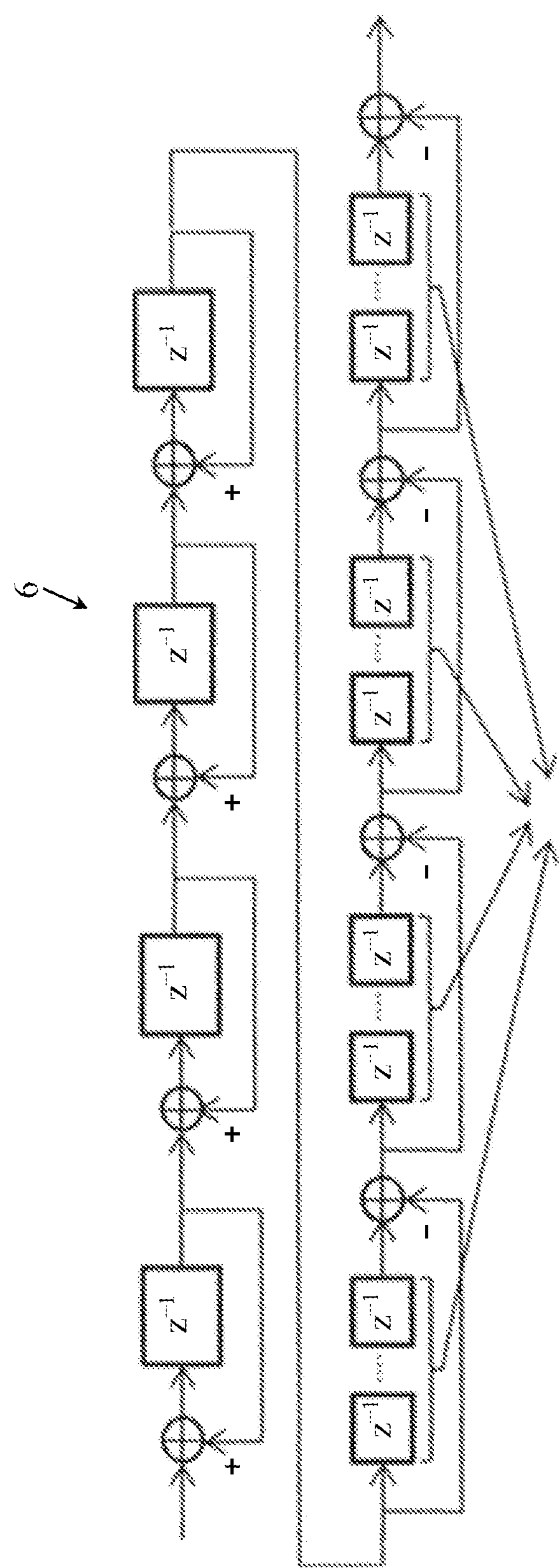
FIG. 2 is a block diagram illustrating an example of a first filter (boxcar filter) according to an example embodiment.

FIG. 2 is a block diagram illustrating an example of a first filter (boxcar filter) according to an example embodiment. The purpose of the boxcar filter 6 is to convert the 1 bit bitstream from the analog-digital converter (1 bit, 3rd-order continuous-time sigma delta modulator) 5 to 20 bit word. The filter 6 is a CIC (Cascaded Integrator-Comb) filter. Without decimation, the filter 6 is hardware intensive due to the long delay chain in the comb section. However, it does simplify the loop design by not having to interpolate. Also, the CIC filter, instead of an IIR (Infinite Impulse Response) filter, preserves the linear phase nature of the path.

PID Controller

Figure 3:
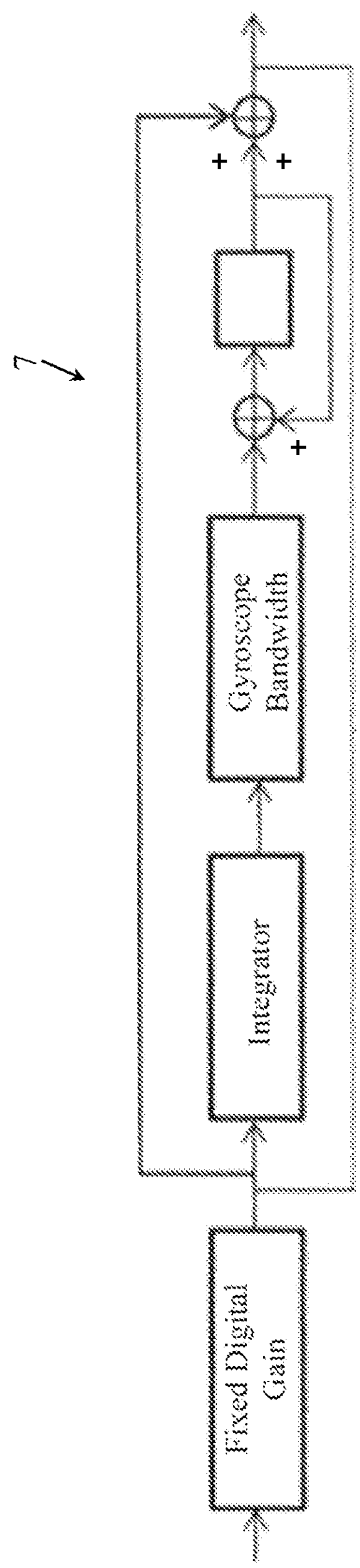
FIG. 3 is a block diagram illustrating an example of a proportional-integral-derivative (PID) controller according to an example embodiment.

FIG. 3 is a block diagram illustrating an example of a PID controller according to an example embodiment. There are two main purposes of the PID controller 7. The first purpose is to minimize the feedback error by inserting an integrator in the forward path. The second purpose is to insert a fixed digital gain in the forward path so that the lack of analog frontend gain is compensated for. The fixed digital gain is adjusted based on the quality factor of the gyroscope (ambient temperature) and input range. When the input range requirement changes, to obtain full scale (FS) at the output of the analog-digital converter 5, the attenuation in the return path needs to be adjusted. Hence, the forward gain has to be adjusted through the fixed digital gain maintain the appropriate overall gain around the FTR loop.

Digital-to-Analog Converter

Figure 4:
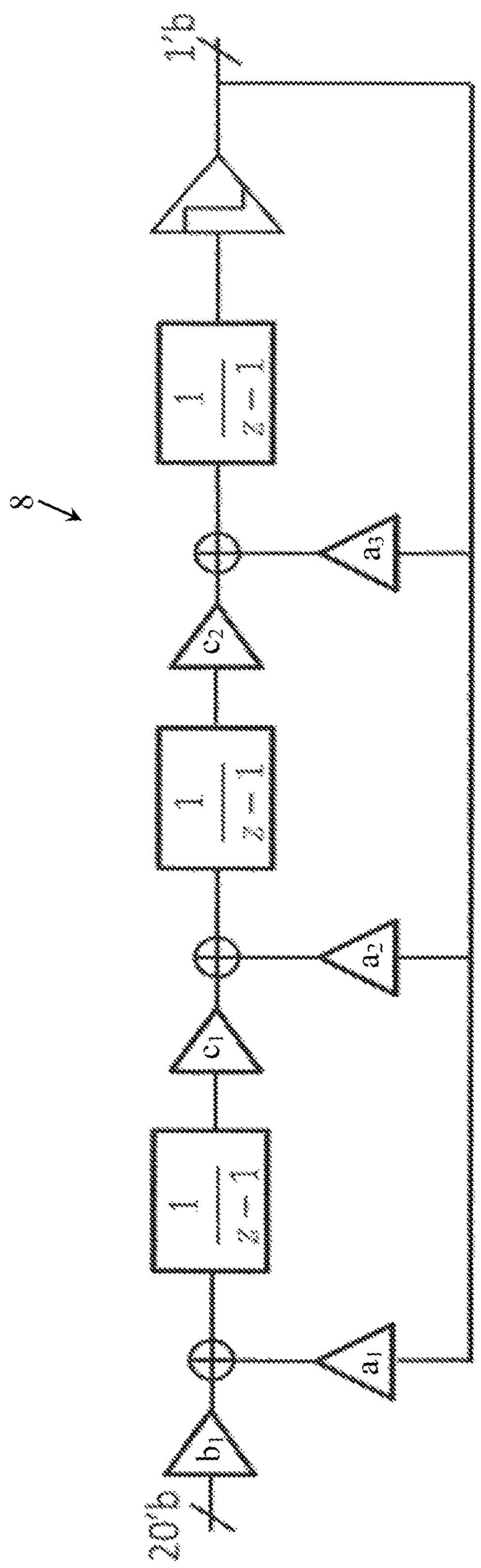
FIG. 4 is a block diagram illustrating an example of a digital-to-analog converter according to an example embodiment.

FIG. 4 is a block diagram illustrating an example of a digital-to-analog converter according to an example embodiment. The 1 bit digital modulator 8 is the frontend of the digital-to-analog converter, which is to convert the digital output of the PID 7 to an analog voltage representing the rate. In order to achieve a high SNR (Signal-to-Noise Ratio) in the band of interest, a sigma-delta modulator is the best architecture for this purpose. Output of the 1 bit digital modulator 8 is the PWM (Pulse Width Modulated) signal of the rate, which makes the analog backend of the digital-to-analog converter 8 relatively simple in meeting the performance requirement.

Second Filter (Switched Capacitor Filter)

Figure 5:
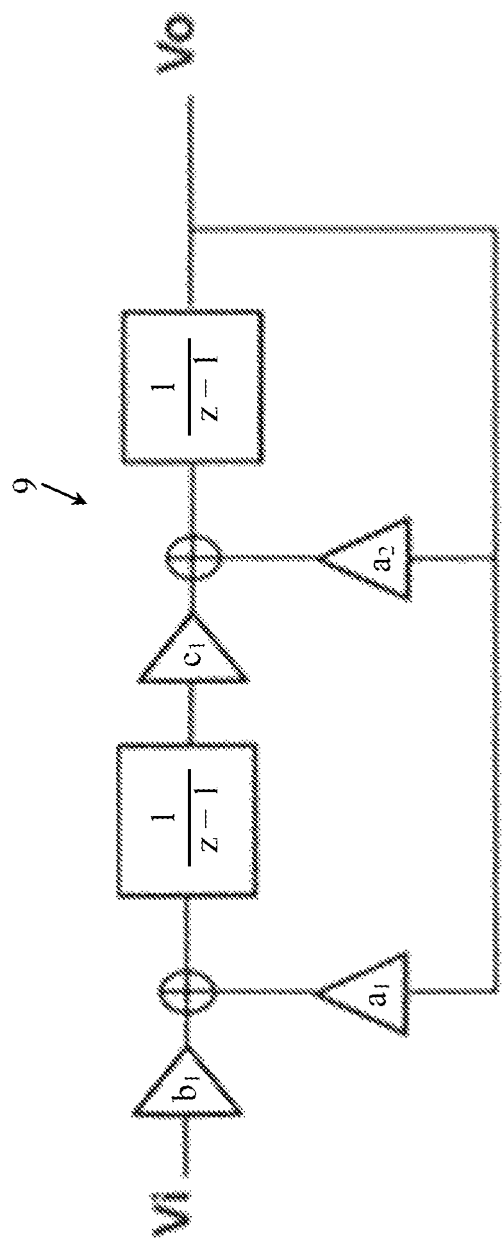
FIG. 5 is a block diagram illustrating an example of a second filter (switched capacitor filter) according to an example embodiment.
Figure 6B:
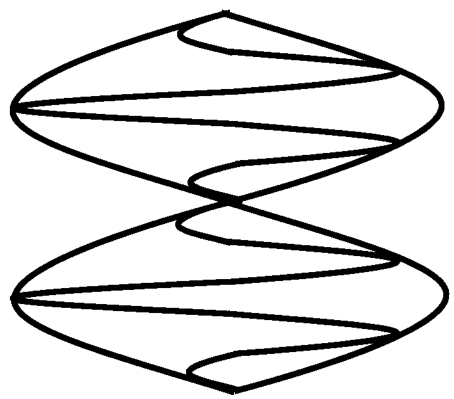
FIGS. 6(A) through 6(I) illustrate examples of signal waveforms at various points in the signal processing circuit for a gyroscope apparatus according to an example embodiment.
Figure 6A:
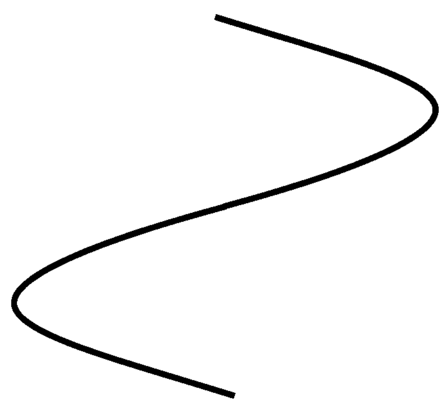
Figure 6D:
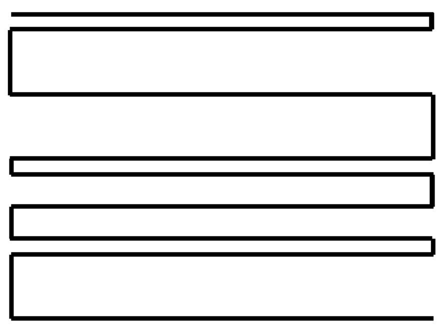
Figure 6C:
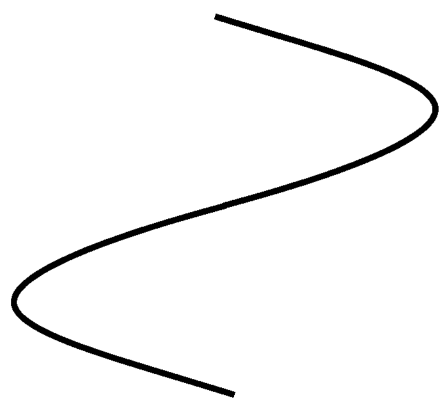
Figure 6F:
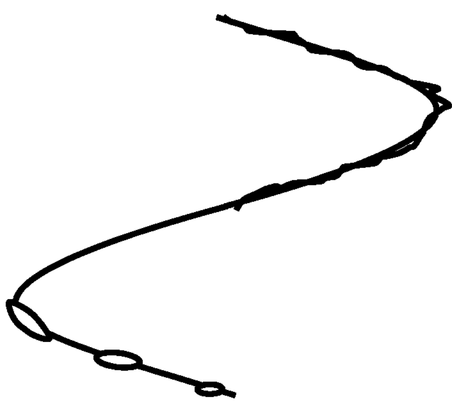
Figure 6E:
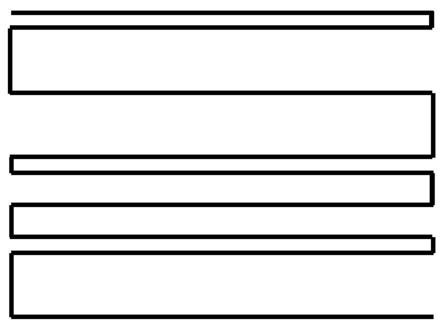
Figure 6H:
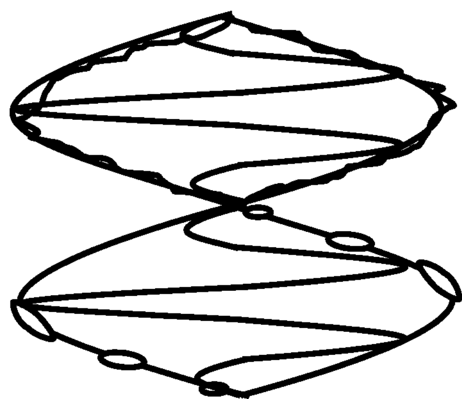
Figure 6G:
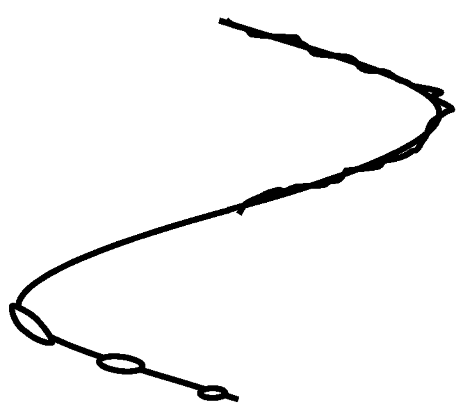
Figure 6I:
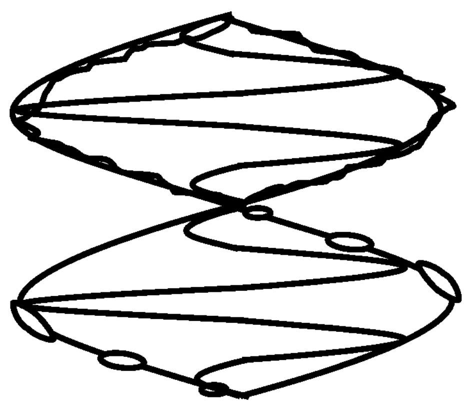

FIG. 5 is a block diagram illustrating an example of a second filter (switched capacitor filter) according to an example embodiment. The purpose of the switched capacitor filter (SCF) 9 is to reduce the rising quantization noise of the 1 bit digital modulator 8 at a higher frequency. It is the analog backend of the digital-to-analog converter 8, which converts the 1 bit PWM (Pulse Width Modulation) rate to an analog signal based on a reference voltage generated from a bandgap. Though the 1 bit digital modulator 8 is 3rd order, a 2nd order SCF is utilized.

Modulator

The modulator 13 includes the voltage-current amplifier 10, the mixer 11, and the TIA 12 and is referred to as the interface electronics. As mentioned previously, the voltage-current amplifier 10 converts the SCF 9 output to a current. The current is modulated onto the gyroscope carrier frequency and fed to TIA 12 to generate the Vftr+/− signal. The mixer 11 is a pair of switches that are switched with square-wave rail-to-rail LO (Local Oscillator) signal. As a result, high level harmonics are generated in the process. These high level harmonics (3fo, 5fo, . . . ) will not affect the performance of the system as they are outside of the bandwidth of the gyroscope 1.

Backend Adjustment

Referring to FIG. 1, SINC2/LPF 14 blocks are placed outside of the FTR loop to further filter out the quantization noise caused by the analog-to-digital modulator 5. These downstream signal conditioning blocks cannot be designed into the FTR loop because of the large phase shift they will cause in the negative feedback. In addition, there are decimation options in these two digital blocks to slow down the rate to that required by user. The gain/offset digital blocks 15 are required to fine tune the output level of the FTR.

FIGS. 6(A) through 6(I) illustrate examples of signal waveforms at various points denoted by reference letters “A” through “I” in the signal processing circuit for a gyroscope apparatus shown in FIG. 1 according to an example embodiment, respectively. The input to the PID 7 will be zero after many iterations of a closed loop.

The example embodiments described above may be implemented using a hardware component. A backend processing device may be implemented using one or more general-purpose or special purpose computers, such as, for example, a processor, a controller and an arithmetic logic unit (ALU), a digital signal processor (DSP), a microcomputer, a field-programmable gate array (FPGA), a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements.

The software may include a computer program, a piece of code, an instruction, or some combination thereof, to independently or collectively instruct or configure the gyroscope system to operate as desired. Software and data may be embodied permanently or temporarily in any type of machine, component, physical or virtual equipment, computer storage medium or device, or in a propagated signal wave capable of providing instructions or data to or being interpreted by the device.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

EXPLANATION OF REFERENCE SYMBOLS

1: Gyroscope
1A: First electrode
1B: Second electrode
1C: Drive electrode
1D: Drive electrode
1E: Gyro
2: Demodulator
3: First transimpedance amplifier and voltage-to-voltage amplifier
4: First mixer (Gilbert cell)
5: Analog-to-digital converter
6: First filter (boxcar filter)
7: Proportional-integral-derivative controller
8: Digital-to-analog converter
9: Second filter (switched capacitor filter)
10: Voltage-to-current amplifier
11: Second mixer (passive mixer)
12: Second transimpedance amplifier
13: Modulator
14: SINC2/low pass filter
15: Gain/offset
16: Vcm
17: Vref
20: Processing circuit
30: Drive circuit
100: Gyroscope apparatus

What is claimed is:

1. A signal processing circuit for a gyroscope apparatus including a first electrode and a second electrode pairing with the first electrode, the signal processing circuit being a negative feedback loop circuit configured to be connected with the first electrode and the second electrode, comprising:

a demodulator configured to convert a current from the first electrode into a voltage and demodulate the converted voltage to output a demodulated signal;

an analog-to-digital converter configured to convert the demodulated signal from the demodulator into a digital signal;

a proportional-integral-derivative controller that is connected to the analog-to-digital converter;

a digital-to-analog converter configured to convert an output signal from the proportional-integral-derivative controller to an analog signal; and a modulator configured to be electrically connected with the second electrode and to be electrically connected with the digital-to-analog converter, wherein the modulator includes a first transimpedance amplifier, a first mixer, and a voltage-to-current amplifier, and the first mixer is a pair of switches that are switched with a square-wave rail-to-rail signal.

2. The signal processing circuit according to claim 1, wherein the demodulator includes a second transimpedance amplifier, a voltage-to-voltage amplifier, and a second mixer configured to demodulate the converted voltage and outputting to the analog-to-digital converter.

3. The signal processing circuit according to claim 1, wherein the analog-to-digital converter is a 1 bit, 3rd-order continuous-time sigma delta modulator.

4. The signal processing circuit according to claim 1, wherein the digital-to-analog converter is a 1 bit, 3rd-order digital sigma delta modulator.

5. The signal processing circuit according to claim 1, wherein the proportional-integral-derivative controller fixes a digital gain based on a quality factor of the gyroscope.

6. The signal processing circuit according to claim 1, wherein the proportional-integral-derivative controller is a digital proportional-integral-derivative controller.

7. A signal processing circuit for a gyroscope apparatus including a first electrode and a second electrode pairing with the first electrode, the signal processing circuit being a negative feedback loop circuit configured to be connected with the first electrode and the second electrode, comprising:

a demodulator configured to convert a current from the first electrode into a voltage and demodulate the converted voltage to output a demodulated signal;

an analog-to-digital converter configured to convert the demodulated signal from the demodulator into a digital signal;

a proportional-integral-derivative controller that is connected to the analog-to-digital converter;

a digital-to-analog converter configured to convert an output signal from the proportional-integral-derivative controller to an analog signal;

a modulator configured to be electrically connected with the second electrode and to be electrically connected with the digital-to-analog converter;

a filter electrically connecting with the digital-to-analog converter and the modulator, wherein the proportional-integral-derivative controller completely converts the digital signal converted by the analog-to-digital converter to a multi-bit digital data and outputs the multi-bit digital data to the digital-to-analog converter, the filter receives the analog signal from the digital-to-analog converter and is configured to reshape the analog signal, the filter is further configured to filter a quantization noise from the reshaped analog signal, and the filter is a 2nd-order switched capacitor filter.

8. The signal processing circuit according to claim 7, wherein the demodulator includes a first transimpedance amplifier, a voltage-to-voltage amplifier, and a first mixer configured to demodulate the converted voltage and outputting to the analog-to-digital converter.

9. The signal processing circuit according to claim 7, wherein the analog-to-digital converter is a 1 bit, 3rd-order continuous-time sigma delta modulator.

10. The signal processing circuit according to claim 7, wherein the digital-to-analog converter is a 1 bit, 3rd-order digital sigma delta modulator.

11. The signal processing circuit according to claim 7, wherein the proportional-integral-derivative controller fixes a digital gain based on a quality factor of the gyroscope.

12. The signal processing circuit according to claim 7, wherein the proportional-integral-derivative controller is a digital proportional-integral-derivative controller.

13. A signal processing circuit for a gyroscope apparatus including a first electrode and a second electrode pairing with the first electrode, the signal processing circuit being a negative feedback loop circuit configured to be connected with the first electrode and the second electrode, comprising:

a demodulator configured to convert a current from the first electrode into a voltage and demodulate the converted voltage to output a demodulated signal;

an analog-to-digital converter configured to convert the demodulated signal from the demodulator into a digital signal;

a proportional-integral-derivative controller that is connected to the analog-to-digital converter;

a digital-to-analog converter configured to convert an output signal from the proportional-integral-derivative controller to an analog signal;

a modulator configured to be electrically connected with the second electrode and to be electrically connected with the digital-to-analog converter; and a filter configured to reduce a shaped quantization noise of the demodulated signal from the demodulator before outputting to the proportional-integral-derivative controller, wherein the filter is a cascaded integrator-comb filter without a decimator.

14. The signal processing circuit according to claim 13, wherein the demodulator includes a first transimpedance amplifier, a voltage-to-voltage amplifier, and a first mixer configured to demodulate the converted voltage and outputting to the analog-to-digital converter.

15. The signal processing circuit according to claim 13, wherein the analog-to-digital converter is a 1 bit, 3rd-order continuous-time sigma delta modulator.

16. The signal processing circuit according to claim 13, wherein the digital-to-analog converter is a 1 bit, 3rd-order digital sigma delta modulator.

17. The signal processing circuit according to claim 13, wherein the proportional-integral-derivative controller fixes a digital gain based on a quality factor of the gyroscope.

18. The signal processing circuit according to claim 13, wherein the proportional-integral-derivative controller is a digital proportional-integral-derivative controller.

* * * * *